US012671363B2

(12) United States Patent
Peng

(10) Patent No.: US 12,671,363 B2
(45) Date of Patent: Jun. 30, 2026

(54) OSCILLATION CIRCUIT AND BUFFER THEREOF

(71) Applicant: RichWave Technology Corp., Taipei City (TW)

(72) Inventor: Shao-Wei Peng, Taipei City (TW)

(73) Assignee: RichWave Technology Corp., Taipei City (TW)

( * ) Notice: Subject to any disclaimer, the term of this patent is extended or adjusted under 35 U.S.C. 154(b) by 0 days.

(21) Appl. No.: 18/976,288

(22) Filed: Dec. 10, 2024

(65) Prior Publication Data

US 2026/0142616 A1 May 21, 2026

(30) Foreign Application Priority Data

Nov. 21, 2024 (TW) ................................ 113144850

(51) Int. Cl.
*H03B 5/12* (2006.01)

(52) U.S. Cl.
CPC ................................. *H03B 5/1212* (2013.01)

(58) Field of Classification Search
CPC .. H03B 5/1212; H03B 5/1228; H03K 3/0315; H03K 3/011; H03K 3/0322
See application file for complete search history.

(56) References Cited

U.S. PATENT DOCUMENTS

| 5,736,903 | A | 4/1998 | Myers | |
| 10,903,823 | B2 * | 1/2021 | Tang | H03B 5/1228 |

| 11,079,415 | B2 * | 8/2021 | Bassi | H03B 5/1234 |
| 2001/0000661 | A1 | 5/2001 | Miyamoto | |
| 2008/0266011 | A1 * | 10/2008 | Kuosmanen | H03L 7/099 |
| | | | | 331/175 |
| 2021/0391826 | A1 * | 12/2021 | Shin | H03B 5/1296 |

FOREIGN PATENT DOCUMENTS

| CN | 105743496 | 11/2018 |
| CN | 114047682 | 8/2022 |
| CN | 114640308 | 6/2024 |
| CN | 118017938 | 6/2024 |

OTHER PUBLICATIONS

Office action mailed on Jul. 10, 2025 for the Taiwan application No. 113144850 filing date Nov. 21, 2024, pp. 1-5.

* cited by examiner

*Primary Examiner* — Jeffrey M Shin
(74) *Attorney, Agent, or Firm* — Winston Hsu

(57) ABSTRACT

An oscillation circuit includes an oscillator and a buffer coupled to the oscillator. The oscillator is used to provide at least one oscillation signal according to an analog control signal. The buffer includes at least one input terminal, at least one output terminal, a buffer unit, a first capacitor array and a second capacitor array. The at least one input terminal is used to receive the at least one oscillation signal. The at least one output terminal is used to provide at least one buffered signal. The buffer unit is coupled between the at least one input terminal and the at least one output terminal. The first capacitor array is used to change a first equivalent capacitance value according to at least one first digital signal. The second capacitor array is used to change a second equivalent capacitance value according to at least one second digital signal.

18 Claims, 4 Drawing Sheets

OSCILLATION CIRCUIT AND BUFFER THEREOF

TECHNICAL FIELD

The present disclosure relates to radio frequency circuits, and more particularly to an oscillation circuit and a buffer thereof capable of dynamic frequency tracking for wideband radar applications.

BACKGROUND

In radio frequency communication systems, a local oscillator (LO) may include a voltage controlled oscillator (VCO) coupled to a buffer. The buffer may be used to isolate signals from other components (e.g., mixers) to prevent interference with VCO operation. Additionally, the buffer may amplify signals from the VCO to enhance the amplitude of the output signal. In other words, the VCO may provide an oscillation signal, and the buffer coupled to the VCO may receive the oscillation signal to buffer and/or amplify it. Generally, the buffer may face a trade-off between efficiency and bandwidth.

For example, in wideband frequency-modulated continuous wave (FMCW) radar applications, the VCO may vary over a large frequency range, such as a sweeping frequency application or a hopping frequency application. As for the gain-frequency response of a buffer, the maximum gain may correspond to a single frequency (referred to as the center frequency). When the radio frequency signal from the preceding circuit (e.g., VCO) has a frequency shift, such as a higher or lower frequency, the buffer may not provide a desired gain. Therefore, there is a need for an oscillation circuit which may provide desired gains for signals of different frequencies, that is, may have a better gain flatness for a large range of signal frequencies, thereby achieving better circuit efficiency.

SUMMARY

An embodiment provides an oscillation circuit comprising an oscillator and a buffer coupled to the oscillator. The oscillator is used to provide at least one oscillation signal according to an analog control signal. The buffer comprises at least one input terminal, at least one output terminal, a buffer unit, a first capacitor array and a second capacitor array. The at least one input terminal is used to receive the at least one oscillation signal. The at least one output terminal is used to provide at least one buffered signal. The buffer unit is coupled between the at least one input terminal and the at least one output terminal. The first capacitor array, coupled to the buffer unit, is used to change a first equivalent capacitance value of the first capacitor array according to at least one first digital signal. The second capacitor array, coupled to the buffer unit, is used to change a second equivalent capacitance value of the second capacitor array according to at least one second digital signal. The at least one second digital signal is generated according to the analog control signal.

An embodiment provides a buffer for buffering at least one oscillation signal from an oscillator. The buffer comprises at least one input terminal, at least one output terminal, a buffer unit, a first capacitor array and a second capacitor array. The at least one input terminal is used to receive the at least one oscillation signal. The at least one output terminal is used to provide at least one buffered signal. The buffer unit is coupled between the at least one input terminal and the at least one output terminal. The first capacitor array, coupled to the buffer unit, is used to change a first equivalent capacitance value of the first capacitor array according to at least one first digital signal. The second capacitor array, coupled to the buffer unit, is used to change a second equivalent capacitance value of the second capacitor array according to at least one second digital signal. The at least one second digital signal is generated according to the analog control signal.

DETAILED DESCRIPTION

Figure 1:
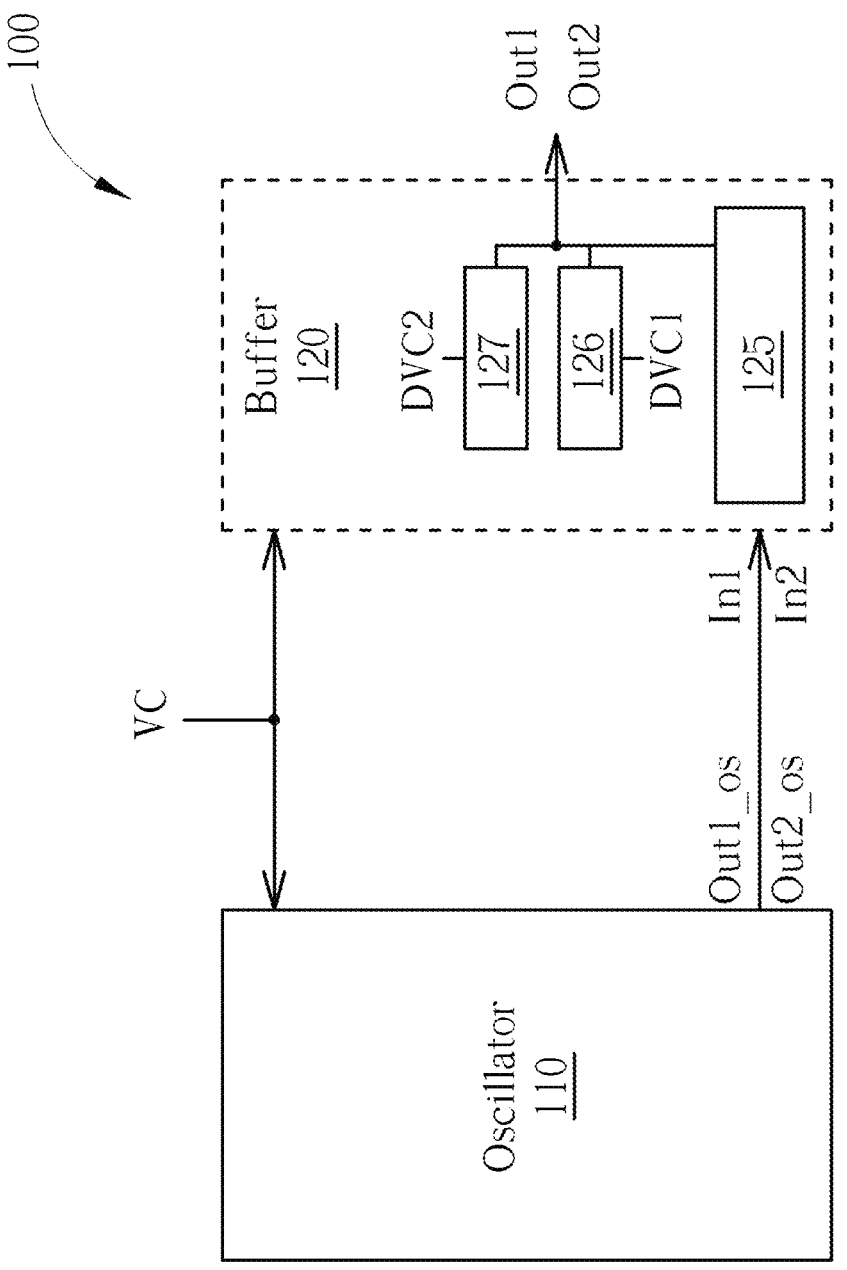
FIG. 1 schematically illustrates a circuit diagram of an oscillation circuit according to an embodiment of the present invention.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts may be omitted for clarity, and like reference numerals refer to like elements throughout.

This disclosure may provide detailed descriptions of various embodiments. Some implementation details are provided herein to help fully understand this disclosure. However, those skilled in the art will understand that the implementation of the present invention is not limited to these implementation details. In some cases, to avoid unnecessarily obscuring this disclosure, detailed descriptions of well-known methods, procedures, components, and circuits may be omitted.

The present invention may be understood by referring to the following detailed description in conjunction with the accompanying drawings. It should be noted that, for the sake of conciseness, the drawings may only show some of the components/steps, and they are not necessarily drawn to scale. Furthermore, the quantities and dimensions of components/steps in the drawings are only illustrative and are not intended to limit the scope of the present invention. In the drawings, components/steps marked with identical or similar symbols may have identical or similar characteristics or functions. However, those skilled in the art should understand that in the industry, the same components/steps might be referred to by different names or symbols. This document does not intend to distinguish between components/steps that have the same function but different names.

It should also be noted that specific embodiments may include additional components/steps, may include equivalents of specific components/steps, or may omit specific components/steps. Moreover, without departing from the spirit of the present invention and in the absence of conflicts, features from different embodiments may be substituted, reorganized, combined, and modified to achieve another embodiment, which still falls within the scope of the present invention. In other words, features described in one drawing or embodiment are not limited to that drawing or embodiment.

In the following description and claims, terms such as "include", "comprise", "contain", "have", etc., are open-ended terms, and therefore should be interpreted as meaning "including but not limited to . . . ". Thus, when these terms are used in the description of the present invention, they may specify the presence of corresponding features but do not exclude the presence of other features.

FIG. 1 schematically illustrates a circuit diagram of an oscillation circuit 100 according to an embodiment of the present invention. The oscillation circuit 100 may include an oscillator 110 and a buffer 120.

In some embodiments, the oscillator 110 may include a voltage-controlled oscillator (also called a VCO). The oscillator 110 may provide an oscillation signal, the frequency of which may be adjusted according to a control signal. For example, the oscillator 110 may include at least one oscillator output terminal (e.g., oscillator output terminals Out1_os, Out2_os) for providing at least one oscillation signal. Based on an analog control signal VC, the frequency of the oscillation signal may change from a first frequency f1 to a second frequency f2, or vice versa.

For example, a phase-locked loop (PLL) circuit may be used to provide an analog control signal VC, which in turn may be used to adjust the output frequency of an oscillator 110. Taking an FMCW radar application as an example, the control voltage VC provided by the phase-locked loop may vary based on a predetermined frequency modulation pattern, so as to drive the oscillator 110 to generate a required frequency-modulated waveform. Specifically, when the phase-locked loop is in a locked state, its output control voltage may cause the oscillator 110 to output an oscillation signal of a specific frequency or a frequency range, which may have a desired tuning range and a good frequency linearity. Furthermore, the phase-locked loop may include a phase frequency detector (PFD), a charge pump(CP), a low-pass filter, a divider and so on.

In some embodiments, the buffer 120 may be coupled to the oscillator 110 to receive the oscillation signal from the oscillator 110, so as to buffer and/or amplify the oscillation signal. As shown in FIG. 1, the buffer 120 may include at least one input terminal (e.g., input terminals In1, In2) and at least one output terminal (e.g., output terminals Out1, Out2). The input terminals In1, In2 may be used to receive at least one oscillation signal from the oscillator 110, and the output terminals Out1, Out2 may be used to provide at least one buffered signal. The buffer 120 may further include a buffer unit 125, a first capacitor array 126, and a second capacitor array 127. The buffer unit 125 may be coupled between input terminals In1, In2 and output terminals Out1, Out2. The first capacitor array 126 may be coupled to the buffer unit 125 and have a first variable equivalent capacitance value. Similarly, the second capacitor array 127 may be coupled to the buffer unit 125 and have a second variable equivalent capacitance value.

Furthermore, the first capacitor array 126 may change its equivalent capacitance value, i.e., the first variable equivalent capacitance value, according to at least one first digital signal DVC1 (for example, first digital signal DVC11 and first digital signal DVC12). The second capacitor array 127 may change its equivalent capacitance value, i.e., the second variable equivalent capacitance value, according to at least one second digital signal DVC2 (for example, second digital signal DVC21 and second digital signal DVC22). In some embodiments, the at least one second digital signal DVC2 may be generated based on the aforementioned analog control signal VC.

Figure 2:
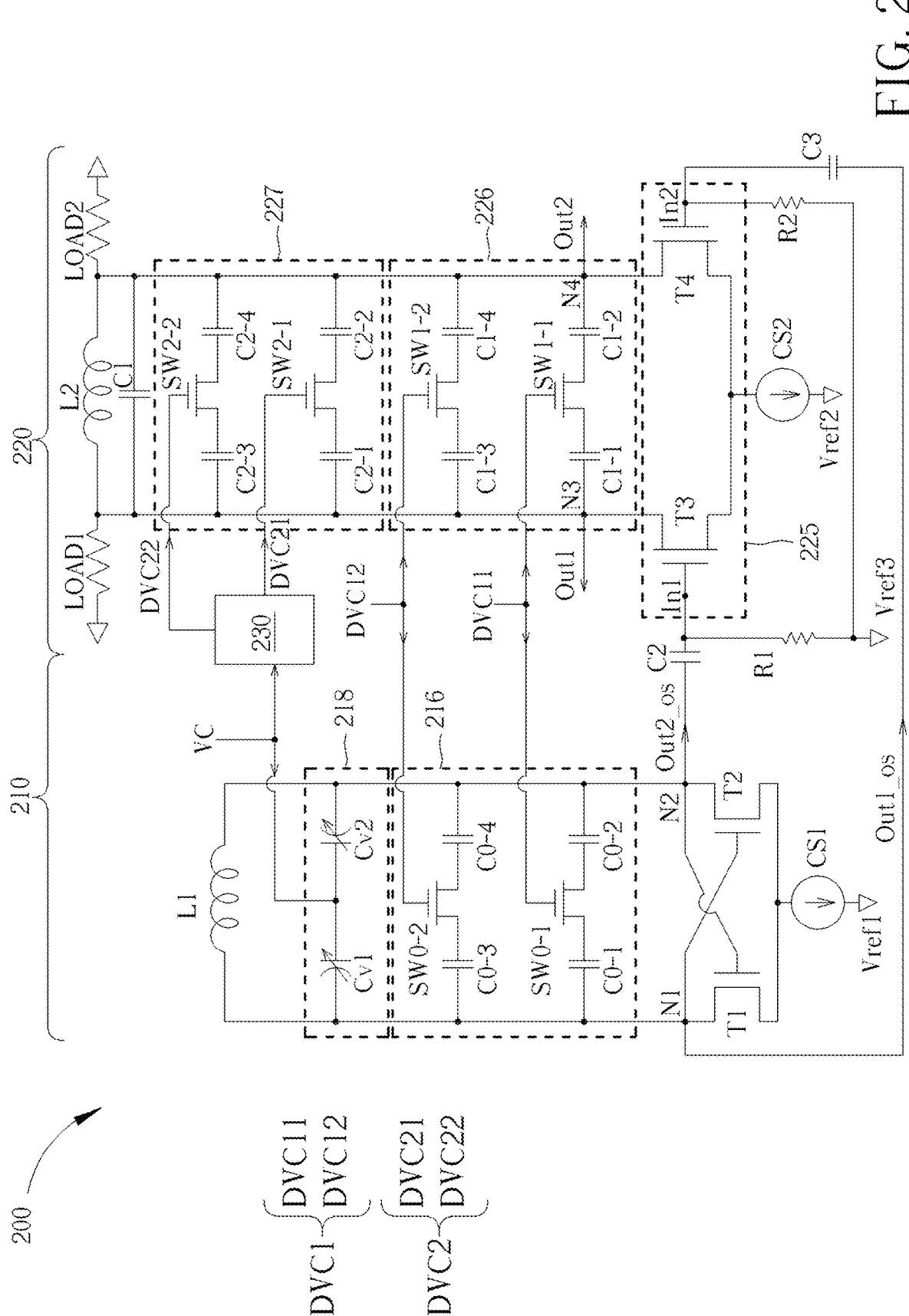
FIG. 2 schematically illustrates a circuit diagram of an oscillation circuit according to another embodiment of the present invention.

FIG. 2 schematically illustrates a circuit diagram of an oscillation circuit 200 according to another embodiment of the present invention. The oscillation circuit 200 may include an oscillator 210 and a buffer 220.

In some embodiments, the oscillator 210 may include a first transistor T1 and a second transistor T2. The first transistor T1 may include a first terminal, a second terminal, and a control terminal. The first terminal may be coupled to a first node N1, the second terminal may be coupled to a first reference voltage terminal Vref1, and the control terminal may be coupled to a second node N2. The second transistor T2 may include a first terminal, a second terminal, and a control terminal. The first terminal may be coupled to the second node N2, the second terminal may be coupled to the first reference voltage terminal Vref1, and the control terminal may be coupled to the first node N1. As shown in FIG. 2, the at least one oscillator output terminal of the oscillator 210 may include a first oscillator output terminal Out1_os and a second oscillator output terminal Out2_os, configured to output a first oscillation signal and a second oscillation signal, respectively. As shown, the first node N1 may be coupled to the first oscillator output terminal Out1_os, and the second node N2 may be coupled to the second oscillator output terminal Out2_os. In some embodiments, the first oscillation signal and the second oscillation signal may form a differential oscillation signal pair.

For example, the first transistor T1 or second transistor T2 may include a field effect transistor (FET) or a bipolar junction transistor (BJT). Taking FET as an example, the first terminal of the first transistor T1 may be either the drain or source, the second terminal may be the other one, and the control terminal may be the gate. Taking BJT as an example, the first terminal of the first transistor T1 may be either the collector or emitter, the second terminal may be the other one, and the control terminal may be the base. It should be noted that the transistor types are only used to schematically illustrate the present invention and not to limit its scope. Furthermore, in some embodiments, the first transistor T1 and second transistor T2 may be implemented using NMOS or PMOS by a complementary metal-oxide-semiconductor (CMOS) process. Particularly in higher frequency applications such as FMCW radar, NMOS may have advantages including higher switching speed and lower on-resistance, making it more desirable. When implemented using NMOS, for the first transistor T1, the drain is coupled to the first node N1, the source is coupled to the first reference voltage terminal Vref1, and the gate is coupled to the second node N2. For the second transistor T2, the drain is coupled to the second node N2, the source is coupled to the first reference voltage terminal Vref1, and the gate is coupled to the first node N1. This cross-coupled structure may form a positive feedback loop, so as to provide a negative impedance for the oscillator.

In some embodiments, the oscillator 210 may further include at least one varactor (also referred as variable capacitor) 218, which may be coupled between the first node N1 and the second node N2. For example, the at least one varactor 218 may include a first varactor Cv1 and a second varactor Cv2, where the first terminal of the first varactor Cv1 may be coupled to the first node N1, and its second terminal may be coupled to the second varactor Cv2. The first terminal of the second varactor Cv2 may be coupled to the first varactor Cv1, and its second terminal may be coupled to the second node N2. As shown, the second terminal of the first varactor Cv1 and the first terminal of the second varactor Cv2 may be used to receive the analog control signal VC, and based on this analog control signal VC, the first varactor Cv1 and/or the second varactor Cv2 may change their equivalent capacitance values, thereby changing the oscillation frequency of oscillation signal from the oscillator 210. Thus, the oscillation frequency of the oscillation signal may be changed based on the analog control signal VC.

In some embodiments, the varactors Cv1 or Cv2 may be implemented in various ways. For example, the varactors Cv1 or Cv2 may be fabricated using a CMOS process. Taking an NMOS structure as an example, the drain and the source may be connected to form the first terminal of the varactor, and the gate may form the second terminal. By changing the voltage applied across the first and second terminals (for example, by changing the level of the analog control signal VC), the equivalent capacitance value of the varactor may be changed.

In some embodiments, the oscillator 210 may further include an oscillator capacitor array 216, which may be coupled between the first node N1 and the second node N2. In some embodiments, the oscillator capacitor array 216 may change its equivalent capacitance value according to at least one first digital signal DVC1 (for example, first digital signal DVC11 and first digital signal DVC12). Specifically, the oscillator capacitor array 216 may include a capacitor C0-1, a switch SW0-1, and a capacitor C0-2. In some embodiments, the capacitor C0-1 and/or the capacitor C0-2 may also be referred to as the first capacitor, and the switch SW0-1 may also be referred to as the first switch.

A first terminal of the capacitor C0-1 may be coupled to the first node N1, a first terminal of the switch SW0-1 may be coupled to a second terminal of the capacitor C0-1, a first terminal of the capacitor C0-2 may be coupled to a second terminal of the switch SW0-1, and a second terminal of the capacitor C0-2 may be coupled to the second node N2. In other words, the capacitor C0-1, the switch SW0-1, and the capacitor C0-2 may be coupled in series between the first node N1 and the second node N2. The coupling order mentioned above is only exemplary and not intended to limit the scope of the present invention. Furthermore, the oscillator capacitor array 216 may also include a capacitor C0-3, a switch SW0-2, and a capacitor C0-4 coupled in series, with their connection relationship similar to that of the capacitor C0-1, the switch SW0-1, and the capacitor C0-2, and details will not be repeated here. In some embodiments, the capacitor C0-3 and/or C0-4 may also be referred to as the second capacitor, and the switch SW0-2 may also be referred to as the second switch. In other embodiments, the oscillator capacitor array 216 may include fewer or more combinations of capacitors and switches.

Furthermore, a control terminal of the switch SW0-1 may receive a first one of the at least one first digital signal DVC1 (as shown in FIG. 1, the first digital signal DVC11), and the switch SW0-1 may be turned on or off according to this first digital signal DVC11. Similarly, a control terminal of the switch SW0-2 may receive a second one of the at least one first digital signal DVC1 (as shown in FIG. 1, the first digital signal DVC12), and the switch SW0-2 may be turned on or off according to this first digital signal DVC12. The turning on or off of switch SW0-1 and/or switch SW0-2 may change the equivalent capacitance value of the oscillator capacitor array 216, thereby changing the frequency of the oscillation signal from the oscillator 210. Therefore, the frequency of the oscillation signal may be changed based on the first digital signal DVC1 (for example, first digital signals DVC11, DVC12).

In some embodiments, the oscillator 210 may further include a first current source CS1 and a first inductor L1. The first current source CS1 may be coupled between the second terminal of the first transistor T1 and the first reference voltage terminal Vref1, and may also be coupled between the second terminal of the second transistor T2 and the first reference voltage terminal Vref1. The first inductor L1 may be coupled between the first node N1 and the second node N2. The configuration of the first current source CS1 and first inductor L1 may be used to ensure conditions required by the oscillator 210.

In some embodiments, the at least one input terminal of the buffer 220 may include a first input terminal In1 and a second input terminal In2, which may be coupled to the second oscillator output terminal Out2_os and the first oscillator output terminal Out1_os of the oscillator 210 respectively, and thus may be used to receive the second oscillation signal and the first oscillation signal respectively. The at least one output terminal of the buffer 220 may include a first output terminal Out1 and a second output terminal Out2, which may be used to provide a first buffered signal and a second buffered signal respectively. In some embodiments, the first buffered signal and the second buffered signal may form a differential buffered signal pair. However, the present invention is not such limited, and in other embodiments, the first input terminal In1 and second input terminal In2 of the buffer 220 may be respectively coupled to the first oscillator output terminal Out1_os and the second oscillator output terminal Out2_os of the oscillator 210.

In some embodiments, the buffer unit 225 of the buffer 220 may provide a gain with a factor of at least 1. Specifically, the buffer unit 225 may include a third transistor T3 and a fourth transistor T4. The third transistor T3 may include a first terminal, a second terminal, and a control terminal. The first terminal may be coupled to a third node N3, the second terminal may be coupled to a second reference voltage terminal Vref2, and the control terminal may be coupled to the first input terminal In1 to receive the first oscillation signal. The fourth transistor T4 may include a first terminal, a second terminal, and a control terminal. The first terminal may be coupled to a fourth node N4, the second terminal may be coupled to the second reference voltage terminal Vref2, and the control terminal may be coupled to the second input terminal In2. Furthermore, the third node N3 may be coupled to the first output terminal Out1 to output the first buffered signal, and the fourth node N4 may be coupled to the second output terminal Out2 to output the second buffered signal. For example, similar to the first transistor T1 or second transistor T2, the third transistor T3 or fourth transistor T4 may also include a field effect transistor (FET) or a bipolar junction transistor (BJT).

In some embodiments, the buffer 220 may further include a first capacitor array 226, which may be coupled to the buffer unit 225. Specifically, the first capacitor array 226 may be coupled between the third node N3 and the fourth node N4, and have a first variable equivalent capacitance value. As shown, the first capacitor array 226 may include a capacitor C1-1, a switch SW1-1, and a capacitor C1-2 coupled in series between the third node N3 and the fourth node N4. In some embodiments, the capacitor C1-1 and/or C1-2 may also be referred to as the first capacitor, and the switch SW1-1 may also be referred to as the first switch. The first capacitor array 226 may further include a capacitor C1-3, a switch SW1-2, and a capacitor C1-4 coupled in series between the third node N3 and the fourth node N4. In some embodiments, the capacitor C1-3 and/or C1-4 may also be referred to as the second capacitor, and the switch SW1-2 may also be referred to as the second switch. Specifically, a control terminal of the switch SW1-1 may be used to receive the first digital signal DVC11, and the switch SW1-1 may be turned on or off according to this first digital signal DVC11. A control terminal of the switch SW1-2 may be used to receive the first digital signal DVC12, and the switch SW1-2 may be turned on or off according to this first digital signal DVC12. In these embodiments, the turning on or off of the switch SW1-1 and/or SW1-2 may change the equivalent capacitance value of the first capacitor array 226.

Furthermore, the switch SW1-1 of the buffer 220 and the switch SW0-1 of the oscillator 210 are both turned on or off according to the first digital signal DVC11. The switch SW1-2 of the buffer 220 and the switch SW0-2 of the oscillator 210 are both turned on or off according to the first digital signal DVC12.

In some embodiments, the buffer 220 may further include a second capacitor array 227, which may be coupled to the buffer unit 225. Specifically, the second capacitor array 227 may be coupled between the third node N3 and the fourth node N4, and have a second variable equivalent capacitance value. As shown, the second capacitor array 227 may include a capacitor C2-1, a switch SW2-1, and a capacitor C2-2 coupled in series between the third node N3 and the fourth node N4. In some embodiments, the capacitor C2-1 and/or C2-2 may also be referred to as the first capacitor, and the switch SW2-1 may also be referred to as the first switch. The second capacitor array 227 may further include a capacitor C2-3, a switch SW2-2, and a capacitor C2-4 coupled in series between the third node N3 and the fourth node N4. In some embodiments, the capacitor C2-3 and/or C2-4 may also be referred to as the second capacitor, and the switch SW2-2 may also be referred to as the second switch. Specifically, a control terminal of the switch SW2-1 may be used to receive the second digital signal DVC21, and the switch SW2-1 may be turned on or off according to this second digital signal DVC21. A control terminal of the switch SW2-2 may be used to receive the second digital signal DVC22, and the switch SW2-2 may be turned on or off according to this second digital signal DVC22. In these embodiments, the turning on or off of the switch SW2-1 and/or SW2-2 may change the equivalent capacitance value of the second capacitor array 227. Furthermore, the second digital signals DVC21 and DVC22 may be generated according to the analog control signal VC. In other embodiments, the first capacitor array 226 or second capacitor array 227 may include fewer or more combinations of capacitors and switches.

In some embodiments, the capacitors in the oscillator capacitor array 216, first capacitor array 226, and/or second capacitor array 227 (e.g., capacitor C0-1, capacitor C1-1, or capacitor C2-1) may be implemented in various ways. For example, metal-insulator-metal (MIM) capacitors may be used. An MIM capacitor may include a first metal layer as the first terminal, a second metal layer as the second terminal, and an insulating layer with a specific dielectric constant between them. The capacitance value of such a capacitor may depend on parameters such as the area of the first metal layer and/or second metal layer, the distance between them, and the thickness of the intermediate insulating layer. MIM capacitors may have characteristics such as a desired linearity, a low parasitic effect, and a high quality factor (Q factor), making them suitable for high-frequency circuits.

In some embodiments, the switches in the oscillator capacitor array 216, the first capacitor array 226, and/or the second capacitor array 227 (e.g., switch SW0-1, switch SW1-1, switch SW2-1) may be implemented in various ways. For example, transistors with appropriate parameters (such as size, on-resistance, etc.) may be used, where the control terminal of a transistor may accept a voltage signal to turn the transistor on or off, thereby achieving the switching on or off function.

As shown in FIG. 2, the buffer 220 may further include an analog-to-digital converter 230, which may be coupled to the second capacitor array 227. The analog-to-digital converter 230 may receive the analog control signal VC and generate the second digital signals DVC21 and DVC22 for the second capacitor array 227 accordingly. For example, different combinations of the second digital signals DVC21 and DVC22 may correspond to four levels of the analog control signal VC, such as the first to the fourth voltage levels incrementally increasing.

For example, when the analog control signal VC is at the first voltage level, the analog-to-digital converter 230 may output a low-level second digital signal DVC21 and a low-level second digital signal DVC22. Consequently, the switch SW2-1 of the second capacitor array 227 may be turned off, and the switch SW2-2 may also be turned off. In this case, the second capacitor array 227 may be substantially equivalent to an open circuit.

Further, when the analog control signal VC is at the second voltage level, the analog-to-digital converter 230 may output a high-level second digital signal DVC21 and a low-level second digital signal DVC22. Consequently, the switch SW2-1 of the second capacitor array 227 may be turned on, and the switch SW2-2 may be turned off. In this case, the equivalent capacitance value of the second capacitor array 227 may be substantially approximated to the series connection of the capacitor C2-1 and the capacitor C2-2. For example, the capacitance value of the capacitor C2-1 may be C, and the capacitance value of the capacitor C2-2 may be C, and thus the equivalent capacitance value of the second capacitor array 227 may be substantially approximated to C/2.

Alternatively, when the analog control signal VC is at the third voltage level, the analog-to-digital converter 230 may output a low-level second digital signal DVC21 and a high-level second digital signal DVC22. Consequently, the switch SW2-1 of the second capacitor array 227 may be turned off, and the switch SW2-2 may be turned on. In this case, the equivalent capacitance value of the second capacitor array 227 may be substantially approximated to the series connection of the capacitor C2-3 and the capacitor C2-4. For example, the capacitance value of the capacitor C2-3 may be 2 C, and the capacitance value of the capacitor C2-4 may be 2 C, and thus the equivalent capacitance value of the second capacitor array 227 may be substantially approximated to C.

Further, when the analog control signal VC is at the fourth voltage level, the analog-to-digital converter 230 may output a high-level second digital signal DVC21 and a high-level second digital signal DVC22. Consequently, the switch SW2-1 of the second capacitor array 227 may be turned on, and the switch SW2-2 may be turned on. In this case, the equivalent capacitance value of the second capacitor array 227 may be substantially approximated to the parallel connection of the followings: the series connection of the capacitor C2-1 and the capacitor C2-2 and the series connection of the capacitor C2-3 and the capacitor C2-4. For example, the capacitance value of the capacitor C2-1 may be C, the capacitance value of the capacitor C2-2 may be C, the capacitance value of the capacitor C2-3 may be 2 C, and the capacitance value of the capacitor C2-4 may be 2 C. Thus the equivalent capacitance value of the second capacitor array 227 may be substantially approximated to 3C/2.

The above-mentioned various aspects of the analog control signal VC are only exemplary embodiments and are not intended to limit the scope of the present invention.

In the above embodiments, the second capacitor array 227 of the buffer 220 may change its equivalent capacitance value according to at least one second digital signal DVC2 (e.g., second digital signals DVC21 and DVC22), and the first varactor Cv1 and/or second varactor Cv2 of the oscillator 210 may change their equivalent capacitance values according to the analog control signal VC. The at least one second digital signal DVC2 is generated based on the analog control signal VC. The dynamic adjustment of capacitance values enables the resonant frequency of the buffer 220 to follow the frequency changes of the oscillator 210. For example, when the frequency of oscillation signal from the oscillator 210 is caused to increase due to a change in the analog control signal VC, the analog-to-digital converter 230 may generate the corresponding second digital signals DVC21 and DVC22 according to the analog control signal VC, thereby correspondingly changing the equivalent capacitance value of the second capacitor array 227. Consequently, the center frequency of the buffer 220 may increases correspondingly, or vice versa. In this configuration, the analog control signal VC and second digital signal DVC2 may be used to achieve a synchronous control mechanism between the buffer 220 and oscillator 210 in the oscillation circuit (e.g., oscillation circuits 100 and 200), enabling the frequency of buffered signal of the buffer 220 to dynamically correspond to the frequency of oscillation signal of the oscillator 210.

Moreover, in the above embodiments, both the first capacitor array 226 of the buffer 220 and the oscillator capacitor array 216 of the oscillator 210 may change their equivalent capacitance values according to the at least one first digital signal DVC1. In this configuration, the first digital signal DVC1 (for example, first digital signals DVC11 and DVC12) may further be used to achieve a synchronous control mechanism between the buffer 220 and oscillator 210 in the oscillation circuit, so as to further enable the frequency of buffered signal of the buffer 220 to dynamically correspond to the frequency of oscillation signal of the oscillator 210.

In some embodiments, the first capacitor array 226 of the buffer 220 may be used to adjust the frequency of the buffered signal in a large range, and the second capacitor array 227 may be used to adjust the frequency of buffered signal in a small range. In other words, the first capacitor array 226 may be used for coarse tuning, and the second capacitor array 227 may be used for fine tuning, such that the peak frequency of the buffer 220 may accurately and continuously track the frequency changes of the oscillation signal from the oscillator 210. In this embodiment, for example, the first capacitor array 226 may include capacitors with large capacitance values, and the second capacitor array 227 may include capacitors with small capacitance values.

Figure 3A:
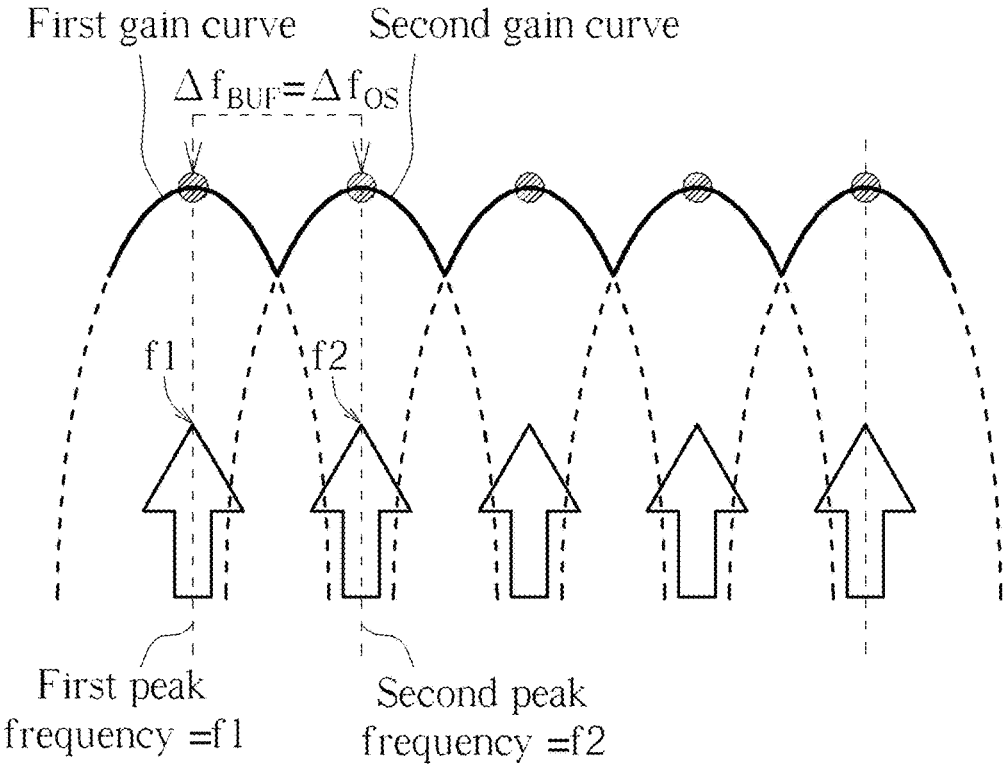
FIG. 3A and FIG. 3B schematically illustrate the gain-frequency response of a buffer according to at least one embodiment of the present invention.
Figure 3B:
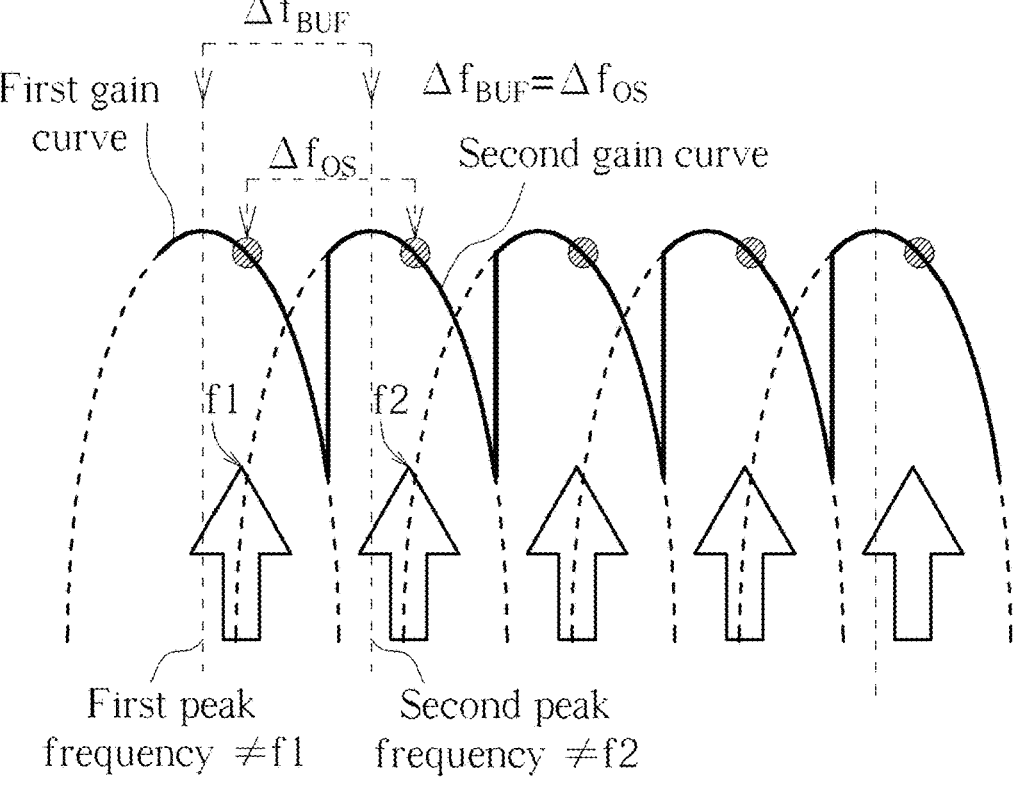

FIG. 3A and FIG. 3B schematically illustrate the gain-frequency response of a buffer according to at least one embodiment of the present invention. The arrows indicate the frequency of the oscillation signal from the oscillator (e.g., the oscillator 110 or 210), and the solid lines indicate the gain curves of the buffer (e.g., the buffer 120 or 220). The gain curves may at least include a first gain curve and a second gain curve. During operation, when the frequency of the oscillation signal from the oscillator is substantially at a first frequency f1, the buffered signal provided by the buffer may exhibit the first gain curve, with the gain peak located at a first peak frequency. When the frequency of the oscillation signal changes to a second frequency f2, the buffered signal may exhibit the second gain curve, with the gain peak located at a second peak frequency. This may be resulted from the aforementioned synchronous control mechanism. Furthermore, in response to the frequency of the oscillation signal changing from the first frequency f1 to the second frequency f2, the peak frequency of the buffered signal may change from the first peak frequency to the second peak frequency. The first peak frequency may correspond to the first frequency, and the second peak frequency may correspond to the second frequency f2.

For example, in FIG. 3A, the peak frequency of the buffered signal may be substantially aligned with the frequency of the oscillation signal (also called the oscillation frequency). For example, the first peak frequency of the buffered signal may be substantially equal to the first frequency f1 of the oscillation signal, and the second peak frequency may be substantially equal to the second frequency f2. In this case, as for the buffered signal, the change $\Delta f_{BUF}$ of peak frequency (i.e., the difference between the second peak frequency and the first peak frequency) is substantially equal to the change $\Delta f_{OS}$ ($\Delta f_{OS}$=f2–f1) of the frequency of the oscillation signal.

However, the present invention is not such limited. The peak frequency of the buffered signal and the oscillation frequency may not be substantially aligned. The peak frequency of the buffered signal may be within 20%, 10%, 5%, etc. of the oscillation frequency. For example, the first peak frequency may be within 20% of the first frequency f1 (of the oscillation signal), and the second peak frequency may be within 20% of the second frequency f2 (of the oscillation signal). For example, in FIG. 3B, the first peak frequency of the buffered signal may be lower than the first frequency f1 of the oscillation signal, and the second peak frequency may also be lower than the second frequency f2. In this case, the peak frequency change $\Delta f_{BUF}$ of the buffered signal may still substantially equal to the frequency change $\Delta f_{OS}$ of the oscillation signal, i.e., $\Delta f_{BUF}=\Delta f_{OS}$.

Furthermore, although FIGS. 3A and 3B schematically illustrate embodiments where $\Delta f_{BUF}=\Delta f_{OS}$, the present invention is not such limited. Those skilled in the art will appreciate that the peak frequency change $\Delta f_{BUF}$ of the buffered signal may not equal to the frequency change $\Delta f_{OS}$ of the oscillation signal. In such embodiments, the peak frequency change $\Delta f_{BUF}$ of the buffered signal may be greater than or less than the frequency change $\Delta f_{OS}$ of the oscillation signal $\Delta f_{OS}$, i.e., $\Delta f_{BUF}>\Delta f_{OS}$, or $\Delta f_{BUF}<\Delta f_{OS}$. Furthermore, in these embodiments, the direction of change for both may be identical. For example, when the frequency of the oscillation signal increases, the peak frequency of the buffered signal also increases, or vice versa.

It should be noted that the above is only exemplary and not intended to limit the present invention. For example, in some embodiments, the frequency of the oscillation signal may be not discrete values (i.e., first frequency f1, second frequency f2). Instead, the frequency of the oscillation signal may change continuously within a range. In this case, the gain curve of the buffer 120 or 220 may appear as a horizontal line within a corresponding range, indicating that its gain may have a single value, meaning that the buffer may provide a relatively steady gain for oscillation signals with continuously changing frequencies. In further embodiments, the gain curve of the buffer may include a stair-step change. For example, the smaller the least significant bit (LSB) of the capacitor arrays in the buffer is, the smoother the stair-step changed gain curve may be, and the smaller the deviation from the ideal case may be. The choice of minimum capacitance bit may affect the tracking precision. By optimization of capacitor array design, good gain characteristics of the oscillation circuit may be achieved, thus suitable for wideband applications such as FMCW radar.

Return to FIG. 2, in some embodiments, the buffer 220 may further include a second inductor L2 and a capacitor C1. The second inductor L2 may be coupled between the third node N3 and the fourth node N4, and thus coupled to the buffer unit 225. The capacitor C1 may also be coupled between the third node N3 and the fourth node N4, and thus coupled to the buffer unit 225. The second inductor L2 and capacitor C1 may form an LC circuit structure, providing the required resonant load, so as to provide appropriate bias conditions. The configuration of these components enables the buffer 220 to provide sufficient gain within the required frequency range. The buffer 220 may further include a first load LOAD1 and a second load LOAD2, which may include but not limited to resistors, current sources, or other load circuit components. The buffer 220 may further include a second current source CS2, which may be coupled to the buffer unit 225. The second current source CS2 may provide appropriate bias current, so as to ensure that the buffer unit 225 may operate at its optimal operating point, meeting gain requirements while maintaining the power consumption within a reasonable range. For example, the second current source CS2 may be coupled between the second terminal of the third transistor T3 and the second reference voltage terminal Vref2, and may also be coupled between the second terminal of the fourth transistor T4 and the second reference voltage terminal Vref2.

In some embodiments, the buffer 220 may further include a first RC circuit and a second RC circuit, coupled to the first input terminal In1 and the second input terminal In2 respectively. For example, the first RC circuit may include a capacitor C2 and a resistor R1. The capacitor C2 may be coupled in series between the second oscillator output terminal Out2_os of the oscillator 210 and the first input terminal In1 of the buffer 220. The resistor R1 may be coupled between the first input terminal In1 of the buffer 220 and a third reference voltage terminal Vref3. The second RC circuit may include a capacitor C3 and a resistor R2. The capacitor C3 may be coupled in series between the first oscillator output terminal Out1_os of the oscillator 210 and the second input terminal In2 of the buffer 220, and the resistor R2 may be coupled between the second input terminal In2 of the buffer 220 and the third reference voltage terminal Vref3. Furthermore, the reference voltage terminals Vref1, Vref2, Vref3 may be the same reference voltage terminal (for example, ground), or different reference voltage terminals depending on the application. The first RC circuit and/or the second RC circuit may be used to filter out a low-frequency noise, for example.

Figure 4:
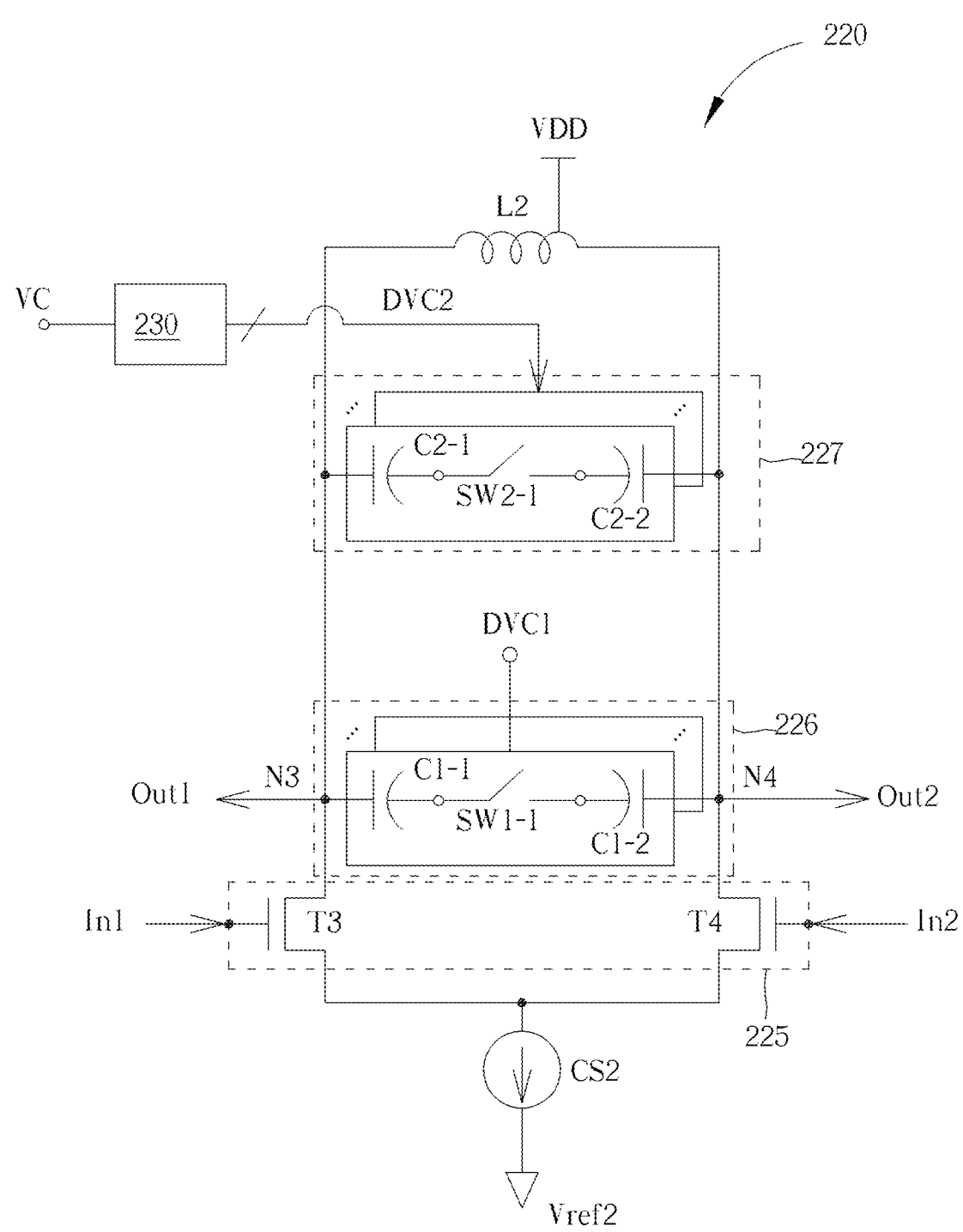
FIG. 4 schematically illustrates a circuit diagram of the buffer according to an embodiment of the present invention.

FIG. 4 schematically illustrates a circuit diagram of the buffer 220 according to an embodiment of the present invention. The buffer 220 may be used for buffering oscillation signals from the oscillator 210 to provide buffered signals. It may be similar to the previously described buffer, and similar aspects will not be repeated here. At least one difference is described as follows.

As shown in FIG. 4, the first capacitor array 226 of the buffer 220 may be coupled to the buffer unit 225 and may change its equivalent capacitance value according to the first digital signal DVC1. The change of this capacitance value may be used, for example, for coarse adjustment of the gain-frequency response of the buffered signal. Similarly, the second capacitor array 227 may be coupled to the buffer unit 225 and may change its equivalent capacitance value according to the second digital signal DVC2. The change in this capacitance value may be used, for example, for fine adjustment of the gain-frequency response of the buffered signal. In FIG. 4, the first capacitor array 226 and the second capacitor array 227 may include more combinations of capacitors and switches.

In at least one embodiment of the present invention, signals (such as the analog control signal VC and the first digital signal DVC1), which are used to control or adjust the oscillator, may be further used to control or adjust the buffer, without an additional complex logic circuit. For example, the analog control signal VC of the oscillator may not only be used to change the frequency of the oscillation signal, but may also be used to generate the second digital signal DVC2 by the analog-to-digital converter 230. This second digital signal DVC2 may be used to adjust the peak frequency of the buffer. Since the second digital signal DVC2 is related to the analog control signal VC, the peak frequency of the buffer is related to the frequency of the oscillation signal.

At least one embodiment of the present invention may provide better performance in numerous applications, such as frequency hopping analysis, wideband analysis of radar signals. In some embodiments, through the frequency tracking mechanism between the buffer and oscillator, the gain-frequency response of the buffer may be changed in response to the oscillation frequency of the oscillator, such that the buffer may provide better gain performances for oscillation signals of different frequencies. For example, the buffer may provide a more consistent gain, thus suitable for wideband applications with improved efficiency.

It should be noted that in this specification and the claims, singular forms of articles "a", "an", "the", etc., are used for descriptive purposes only and should be interpreted as meaning "including but not limited to . . . ". Therefore, when these terms are used in the description of the present invention, they may indicate the presence of corresponding features but do not exclude the presence of other features.

In this document, terms such as "coupled", "connected", "electrically connected", etc., may be used interchangeably, and their meanings should be broadly understood as indicating electrical and/or electronic connection status. These terms should not be interpreted restrictively but should include various forms of electrical or electronic connections. In this document, for example, when mentioning that one element is coupled to another element, it may be directly coupled or indirectly coupled through other elements. The reference voltage terminals mentioned in this document may provide substantially stable reference voltages. The reference voltage terminals mentioned in this document may be, but are not limited to, ground terminals. It should be noted that the directional terms "up", "down", "left", "right" used in this case are only for illustrative purposes to describe structures or methods, they are not used to limit the present invention, and they may represent different meanings in different descriptions of the same figure or in different figures of the same description.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. An oscillation circuit, comprising:
an oscillator, configured to provide at least one oscillation signal having a first frequency according to an analog control signal;
a buffer, coupled to the oscillator, comprising:
at least one input terminal, configured to receive the at least one oscillation signal;
at least one output terminal, configured to provide at least one buffered signal;
a buffer unit, coupled between the at least one input terminal and the at least one output terminal;
a first capacitor array, coupled to the buffer unit, and configured to change a first equivalent capacitance value of the first capacitor array according to at least one first digital signal; and
a second capacitor array, coupled to the buffer unit, and configured to change a second equivalent capacitance value of the second capacitor array according to at least one second digital signal;
wherein the at least one second digital signal is generated according to the analog control signal;
wherein the buffer has a first gain curve, the first gain curve has a first peak frequency, and the first peak frequency corresponds to the first frequency.

2. The oscillation circuit of claim 1, wherein the buffer further comprises:
an analog-to-digital converter, coupled to the second capacitor array, and configured to receive the analog control signal and to generate the at least one second digital signal according to the analog control signal.

3. The oscillation circuit of claim 1, wherein:
the at least one oscillation signal further has a second frequency;
the buffer further has a second gain curve, wherein the second gain curve has a second peak frequency; and
the second peak frequency corresponds to the second frequency.

4. An oscillation circuit, comprising:
an oscillator, configured to provide at least one oscillation signal according to an analog control signal, wherein the at least one oscillation signal comprises a first oscillation signal and a second oscillation signal, wherein the oscillator comprises:
a first oscillator output terminal, configured to output the first oscillation signal;
a second oscillator output terminal, configured to output the second oscillation signal;
a first transistor, comprising a first terminal, a second terminal, and a control terminal, wherein the first terminal is coupled to a first node, the second terminal is coupled to a first reference voltage terminal, and the control terminal is coupled to a second node;
a second transistor, comprising a first terminal, a second terminal, and a control terminal, wherein the first terminal is coupled to the second node, the second terminal is coupled to the first reference voltage terminal, and the control terminal is coupled to the first node, wherein the first node is coupled to the first oscillator output terminal, and the second node is coupled to the second oscillator output terminal; and
an oscillator capacitor array, coupled between the first node and the second node and configured to change an equivalent capacitance value of the oscillator capacitor array according to at least one first digital signal;
a buffer, coupled to the oscillator, comprising:
at least one input terminal, configured to receive the at least one oscillation signal;
at least one output terminal, configured to provide at least one buffered signal;
a buffer unit, coupled between the at least one input terminal and the at least one output terminal;
a first capacitor array, coupled to the buffer unit, and configured to change a first equivalent capacitance value of the first capacitor array according to the at least one first digital signal; and
a second capacitor array, coupled to the buffer unit, and configured to change a second equivalent capacitance value of the second capacitor array according to at least one second digital signal;
wherein the at least one second digital signal is generated according to the analog control signal.

5. The oscillation circuit of claim 4, wherein the at least one input terminal of the buffer comprises a first input terminal, the at least one output terminal of the buffer comprises a first output terminal, and the at least one buffered signal comprises a first buffered signal, wherein the buffer unit comprises:
a third transistor, comprising a first terminal, a second terminal, and a control terminal, wherein the first terminal is coupled to a third node, the second terminal is coupled to a second reference voltage terminal, and the control terminal is coupled to the first input terminal and is configured to receive the first oscillation signal, wherein the third node is coupled to the first output terminal and is configured to output the first buffered signal.

6. The oscillation circuit of claim 5, wherein the at least one input terminal further comprises a second input terminal, the at least one output terminal further comprises a second output terminal, and the at least one buffered signal further comprises a second buffered signal, wherein the buffer unit further comprises:
a fourth transistor, comprising a first terminal, a second terminal, and a control terminal, wherein the first terminal is coupled to a fourth node, the second terminal is coupled to the second reference voltage terminal, and the control terminal is coupled to the second input terminal and is configured to receive the second oscillation signal, wherein the fourth node is coupled to the second output terminal and is configured to output the second buffered signal.

7. The oscillation circuit of claim 6, wherein:
the oscillator further comprises at least one varactor, coupled between the first node and the second node and configured to change a capacitance value of the at least one varactor according to the analog control signal;
the second capacitor array of the buffer is coupled between the third node and the fourth node, and the second capacitor array comprises a first capacitor and a first switch coupled in series.

8. The oscillation circuit of claim 7, wherein a control terminal of the first switch of the second capacitor array is configured to receive a first one of the at least one second digital signal, and the first switch of the second capacitor array is turned on or off according to the first one, thereby changing the second equivalent capacitance value of the second capacitor array.

9. The oscillation circuit of claim 8, wherein the second capacitor array further comprises a second capacitor and a second switch coupled in series, wherein a control terminal of the second switch of the second capacitor array is configured to receive a second one of the at least one second digital signal, and the second switch of the second capacitor array is turned on or off according to the second one, thereby changing the second equivalent capacitance value of the second capacitor array.

10. The oscillation circuit of claim 7, wherein the at least one varactor comprises:

a first varactor and a second varactor, wherein a first terminal of the first varactor is coupled to the first node, a first terminal of the second varactor is coupled to a second terminal of the first varactor, and a second terminal of the second varactor is coupled to the second node.

11. The oscillation circuit of claim 6, wherein:

the oscillator capacitor array of the oscillator comprises a first capacitor and a first switch coupled in series;

the first capacitor array of the buffer is coupled between the third node and the fourth node, and the first capacitor array comprises a first capacitor and a first switch coupled in series;

wherein a control terminal of the first switch of the oscillator capacitor array is configured to receive a first one of the at least one first digital signal, and the first switch of the oscillator capacitor array is turned on or off according to the first one, thereby changing the equivalent capacitance value of the oscillator capacitor array;

wherein a control terminal of the first switch of the first capacitor array is configured to receive the first one of the at least one first digital signal, and the first switch of the first capacitor array is turned on or off according to the first one, thereby changing the first equivalent capacitance value of the first capacitor array.

12. The oscillation circuit of claim 11, wherein the oscillator capacitor array further comprises a second capacitor and a second switch coupled in series, and the first capacitor array further comprises a second capacitor and a second switch coupled in series;

wherein a control terminal of the second switch of the oscillator capacitor array is configured to receive a second one of the at least one first digital signal, and the second switch of the oscillator capacitor array is turned on or off according to the second one, thereby changing the equivalent capacitance value of the oscillator capacitor array;

wherein a control terminal of the second switch of the first capacitor array is configured to receive the second one of the at least one first digital signal, and the second switch of the first capacitor array is turned on or off according to the second one, thereby changing the first equivalent capacitance value of the first capacitor array.

13. The oscillation circuit of claim 4, wherein the oscillator further comprises:

a first current source, coupled between the second terminal of the first transistor and the first reference voltage terminal, and coupled between the second terminal of the second transistor and the first reference voltage terminal; and a first inductor, coupled between the first node and the second node.

14. A buffer for buffering at least one oscillation signal having a first frequency from an oscillator, comprising:

at least one input terminal, configured to receive the at least one oscillation signal;

at least one output terminal, configured to provide at least one buffered signal;

a buffer unit, coupled between the at least one input terminal and the at least one output terminal;

a first capacitor array, coupled to the buffer unit and configured to change a first equivalent capacitance value of the first capacitor array according to at least one first digital signal; and a second capacitor array, coupled to the buffer unit and configured to change a second equivalent capacitance value of the second capacitor array according to at least one second digital signal;

wherein the at least one second digital signal is generated according to an analog control signal, and the analog control signal is configured to adjust a frequency of the at least one oscillation signal;

wherein the buffer has a first gain curve, the first gain curve has a first peak frequency, and the first peak frequency corresponds to the first frequency.

15. The buffer of claim 14, further comprising:

an analog-to-digital converter, coupled to the second capacitor array, configured to receive the analog control signal and configured to generate the at least one second digital signal according to the analog control signal.

16. The buffer of claim 14, wherein the at least one oscillation signal further has a second frequency and the buffer further has a second gain curve, wherein the second gain curve has a second peak frequency, and the second peak frequency corresponds to the second frequency.

17. The buffer of claim 14, wherein the buffer further comprises a second inductor coupled to the buffer unit.

18. The buffer of claim 14, wherein the buffer further comprises a second current source coupled to the buffer unit.

* * * * *